(12) United States Patent
Glass et al.

(10) Patent No.: US 9,705,000 B2
(45) Date of Patent: *Jul. 11, 2017

(54) III-V LAYERS FOR N-TYPE AND P-TYPE MOS SOURCE-DRAIN CONTACTS

(71) Applicant: INTEL CORPORATION, Santa Clara, CA (US)

(72) Inventors: Glenn A. Glass, Portland, OR (US); Anand S. Murthy, Portland, OR (US); Tahir Ghani, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/212,991

(22) Filed: Jul. 18, 2016

(65) Prior Publication Data

US 2016/0329431 A1 Nov. 10, 2016

Related U.S. Application Data

(63) Continuation of application No. 14/875,167, filed on Oct. 5, 2015, now Pat. No. 9,397,102, which is a
(Continued)

(51) Int. Cl.
*H01L 29/786* (2006.01)
*H01L 27/092* (2006.01)
(Continued)

(52) U.S. Cl.
CPC .. *H01L 29/78618* (2013.01); *H01L 21/76805* (2013.01); *H01L 21/76886* (2013.01);
(Continued)

(58) Field of Classification Search
CPC ............. H01L 21/823821; H01L 21/28; H01L 27/092; H01L 27/0924; H01L 29/66545;
(Continued)

(56) References Cited

U.S. PATENT DOCUMENTS 7,943,469 B2    5/2011  Cook, Jr. et al.
8,420,459 B1 *  4/2013  Cheng ............... H01L 29/66477
                                                              257/E21.32
(Continued)

FOREIGN PATENT DOCUMENTS

TW    201025017 A    1/2010
TW    201120960 A    6/2011
WO    2013095375 A1  6/2013

OTHER PUBLICATIONS

Office Action and Search Report received for TW Application No. 101147882. Office Action Issued Feb. 5, 2015. 16 pages. English translation included.

(Continued)

*Primary Examiner* — Christine Enad
(74) *Attorney, Agent, or Firm* — Finch & Maloney PLLC

(57) ABSTRACT

Techniques are disclosed for forming transistor devices having reduced parasitic contact resistance relative to conventional devices. In some example embodiments, the techniques can be used to implement the contacts of MOS transistors of a CMOS device, where an intermediate III-V semiconductor material layer is provided between the p-type and n-type source/drain regions and their respective contact metals to significantly reduce contact resistance. The intermediate III-V semiconductor material layer may have a small bandgap (e.g., lower than 0.5 eV) and/or otherwise be doped to provide the desired conductivity. The techniques can be used on numerous transistor architectures (e.g., planar, finned, and nanowire transistors), including strained and unstrained channel structures.

19 Claims, 7 Drawing Sheets

Related U.S. Application Data continuation of application No. 13/976,074, filed as application No. PCT/US2011/066132 on Nov. 20, 2011, now Pat. No. 9,153,583.

(51) Int. Cl.

| | |
|---|---|
| *H01L 29/78* | (2006.01) |
| *H01L 21/8238* | (2006.01) |
| *H01L 29/417* | (2006.01) |
| *H01L 29/66* | (2006.01) |
| *H01L 29/08* | (2006.01) |
| *H01L 29/06* | (2006.01) |
| *H01L 29/10* | (2006.01) |
| *H01L 29/267* | (2006.01) |
| *H01L 21/768* | (2006.01) |
| *H01L 29/423* | (2006.01) |

(52) U.S. Cl.
CPC ............ *H01L 21/76895* (2013.01); *H01L 21/823807* (2013.01); *H01L 21/823814* (2013.01); *H01L 21/823821* (2013.01); *H01L 21/823871* (2013.01); *H01L 27/092* (2013.01); *H01L 27/0924* (2013.01); *H01L 29/0669* (2013.01); *H01L 29/0673* (2013.01); *H01L 29/0847* (2013.01); *H01L 29/1037* (2013.01); *H01L 29/267* (2013.01); *H01L 29/41791* (2013.01); *H01L 29/42392* (2013.01); *H01L 29/66545* (2013.01); *H01L 29/78* (2013.01); *H01L 29/78654* (2013.01); *H01L 29/78684* (2013.01); *H01L 29/78696* (2013.01)

(58) Field of Classification Search
CPC    H01L 29/0847; H01L 29/41791; H01L 29/78
See application file for complete search history.

(56) References Cited

U.S. PATENT DOCUMENTS

| | | | |
|---|---|---|---|
| 8,823,011 B2 | 9/2014 | Chan | |
| 8,896,066 B2 | 11/2014 | Glass et al. | |
| 9,059,024 B2 | 6/2015 | Glass et al. | |
| 9,153,583 B2 * | 10/2015 | Glass | .................. H01L 29/0847 |
| 9,397,102 B2 * | 7/2016 | Glass | .................. H01L 29/0847 |
| 2005/0266654 A1 | 12/2005 | Hattendorf et al. | |
| 2007/0132057 A1 | 6/2007 | Curello et al. | |
| 2007/0178642 A1 | 8/2007 | Kim et al. | |
| 2008/0001191 A1 | 1/2008 | Pruefer et al. | |
| 2008/0124878 A1 * | 5/2008 | Cook | ................ H01L 29/66621 438/300 |
| 2008/0203432 A1 * | 8/2008 | Kim | .................... H01L 29/1054 257/192 |
| 2008/0297419 A1 | 12/2008 | Dou et al. | |
| 2011/0068407 A1 | 3/2011 | Yeh et al. | |
| 2011/0133167 A1 * | 6/2011 | Bangsaruntip | ......... B82Y 10/00 257/24 |
| 2012/0187505 A1 * | 7/2012 | Guo | .................... H01L 29/0847 257/401 |
| 2012/0305891 A1 | 12/2012 | Nayfeh et al. | |
| 2013/0043482 A1 | 2/2013 | Chan | |
| 2013/0154016 A1 | 6/2013 | Glass et al. | |
| 2013/0285155 A1 | 10/2013 | Glass et al. | |
| 2013/0299895 A1 | 11/2013 | Oxland et al. | |
| 2015/0054031 A1 | 2/2015 | Glass et al. | |
| 2016/0027781 A1 | 1/2016 | Glass et al. | |

OTHER PUBLICATIONS

International Search Report and Written Opinion received for PCT Patent Application No. PCT/US2011/66132, mailed on Aug. 31, 2012. 10 pages.

Cooke, Mike, "Making III-V Contact with Silicon Substrates," Semiconductor Today, Compounds & Advanced Silicon, vol. 6, Issue 3. Apr./May 2011. 5 pages.

"Semiconductor" Wikipedia, page last modified Nov. 13, 2011. Date accessed: Nov. 16, 2011 11 pages.

U.S. Appl. No. 14/875,167, filed Oct. 5, 2015, Patented.
U.S. Appl. No. 13/976,074, filed Jun. 26, 2013, Patented.
U.S. Appl. No. 13/685,369, filed Nov. 26, 2012, Patented.
U.S. Appl. No. 14/517,365, filed Oct. 17, 2014, Pending.

* cited by examiner

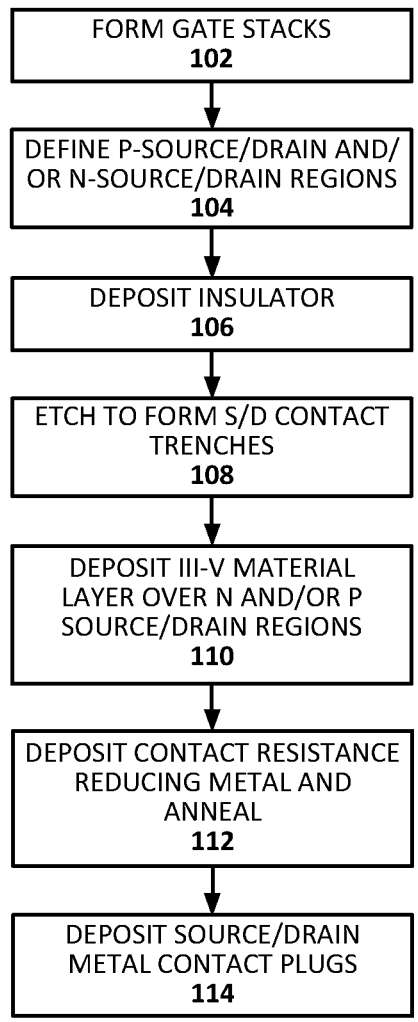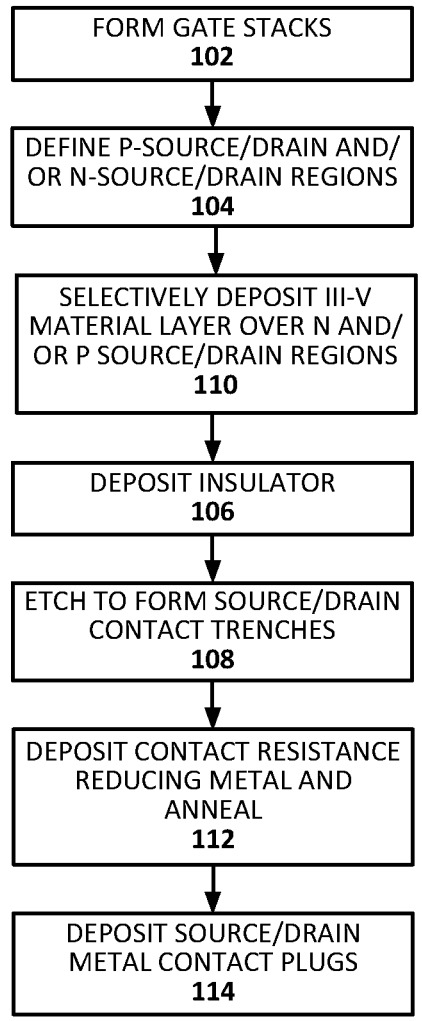
FIG. 1A
FIG. 1B

III-V LAYERS FOR N-TYPE AND P-TYPE MOS SOURCE-DRAIN CONTACTS

RELATED APPLICATION

This application is a continuation of U.S. application Ser. No. 14/875,167 filed Oct. 5, 2015 (now U.S. Pat. No. 9,397,102), which is a continuation of U.S. application Ser. No. 13/976,074 filed Jun. 26, 2013 (now U.S. Pat. No. 9,153,583), which is a U.S. National Phase of International Application PCT/US2011/066132 filed Dec. 20, 2011. Each of these applications is herein incorporated by reference in its entirety.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to minimize the parasitic resistance associated with contacts otherwise known as external resistance Rext. Decreased Rext enables higher current from an equal transistor design.

BRIEF DESCRIPTION OF THE DRAWINGS

FIG. 1A is a method for forming a transistor structure with low contact resistance in accordance with an embodiment of the present invention.

FIG. 1B is a method for forming a transistor structure with low contact resistance in accordance with another embodiment of the present invention.

Figure 2A:
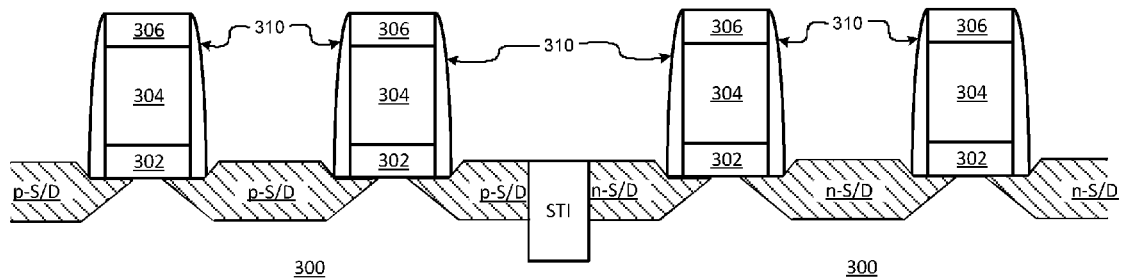
FIGS. 2A to 2F illustrate structures that are formed when carrying out the method of FIG. 1A, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming transistor devices having reduced parasitic contact resistance relative to conventional devices. The techniques can be implemented, for instance, at the point in the semiconductor process flow where traditional contact processing would employ a silicide directly on a silicon source drain region, and using a standard contact stack such as a series of metals on silicon (Si) or silicon germanium (SiGe) or germanium (Ge) source/drain regions. In some embodiments, the techniques can be used to implement the contacts of MOS transistors of a CMOS device, where an intermediate III-V semiconductor material layer is provided between the p-type and n-type source/drain regions and their respective contact metals to significantly reduce contact resistance. The intermediate III-V semiconductor material layer may have a small bandgap (e.g., lower than 0.5 eV) and/or otherwise be doped to provide the desired conductivity. The techniques can be used on numerous transistor architectures (e.g., planar, finned, and nanowire transistors), including strained and unstrained channel structures.

General Overview

As previously explained, increased drive current in the transistors can be achieved by reducing device resistance. Contact resistance is one component of a device's overall resistance. A typical transistor contact stack includes, for example, a silicon or SiGe source/drain layer, a silicide/germanide layer, a titanium nitride adhesion layer, and a tungsten contact/plug. Silicides and germanides of metals such as nickel, platinum, titanium, cobalt, etc can be formed on the source-drain regions prior to tungsten plug deposition. In such configurations, the contact resistance is relatively high and effectively limited by the silicon or SiGe valence band alignment to the pinning level in the metal. Typical industry approaches to forming contacts generally employ alloys with bandgaps in the range 0.5-1.5 eV, or higher. While some such approaches may be appropriate for n-type transistor structures, they are not appropriate for p-type transistor structures.

Thus, and in accordance with an embodiment of the present invention, an intermediate III-V semiconductor material layer is deposited after source/drain formation but before metal contact deposition. Note that the same intermediate III-V semiconductor material layer can be deposited over both p-type and n-type source/drain regions. In some embodiments, the III-V material layer is selected to have a narrow bandgap such as, for example, indium antimonide (InSb) or other related compounds with bandgaps below 0.5 eV, including various combinations of aluminum (Al), gallium (Ga), indium (In), phosphorus (P), arsenic (As), and/or antimony (Sb). Such small bandgap III-V material layers can be used, for example, to provide good contact properties to MOS transistor source-drain regions such as p-type and n-type Si, SiGe alloy, and Ge source-drain regions. In other embodiments, III-V materials having an arbitrary bandgap can be deposited and doped, thereby increasing their conductivity to a level comparable to small bandgap III-V materials, or to otherwise acceptable conductivity levels for the given application.

Note that in some embodiments, the III-V semiconductor material can be left undoped, and particularly with respect to III-V materials having bandgaps below about 0.5 eV, since the thermal generation of carriers in such small bandgap materials is sufficient at room temperature to enable high conductivity. In other embodiments where doping is used, such as those using III-V materials having an arbitrary bandgap, the doping can be carried out in a number of ways, including both in-situ and ex-situ doping techniques. Some such embodiments employ the use III-V materials having sufficiently high doping levels with a column IV dopant, such as carbon, silicon, germanium, or tin. At very high doping levels (e.g., greater than 1E18 atoms/cm$^3$ substitutional concentration), these amphoteric dopants contribute carriers in both valence and conduction bands, thereby increasing carrier concentration for both carrier types. In some such case, the doping is carried out in-situ. In other embodiments, an intrinsic III-V material layer is deposited, followed by an ex-situ doping process, such as ion implantation or diffusion doping, so as to provide the desired conductivity (e.g., conductivity with values of for example 100 to 500 S/cm). In some example cases, the III-V material layer can doped such that p-type regions have a first doping scheme and n-type regions have a second doping scheme. For instance, n-type source/drain regions can be doped with, for example, silicon, germanium, or tellurium, and p-type source/drain regions can be doped with zinc or cadmium. As will be appreciated in light of this disclosure, such embodiments involving multiple doping schemes will generally require additional patterning steps.

Further note that the III-V material layer can be employed to improve contact resistance in any number of transistor structures and configurations, including planar, raised source/drain, non-planer (e.g., nanowire transistors and finned transistors such as double-gate and trigate transistor structures), as well as strained and unstrained channel structures. In addition, the transistor structures may include source and drain tip regions that are designed, for instance, to decrease the overall resistance of the transistor while improving short channel effects (SCE), as sometimes done. Any number of structural features can be used in conjunction with a III-V semiconductor material layer as described herein.

The transistor structure may include p-type source/drain regions, n-type source/drain regions, or both n-type and p-type source/drain regions. In some example embodiments, the transistor structure includes dopant-implanted source/drain regions or epitaxial (or polycrystalline) replacement source/drain regions of silicon, SiGe alloys, or nominally pure germanium films (e.g., such as those with less than 10% silicon) in a MOS structure. In any such implementations, a layer or cap of III-V semiconductor material can be formed directly over the source/drain regions, in accordance with an embodiment of the present invention. The III-V material layer can be formed directly over other parts of the transistor structure as well, such as poly gates and/or grounding tap regions or other such areas where low contact resistance is desired, if so desired.

Upon analysis (e.g., scanning electron microscopy and/or composition mapping), a structure configured in accordance with an embodiment of the present invention composition will effectively show an additional layer of III-V semiconductor material comprising combinations of, for instance, Al, Ga, In, P, As and/or Sb (along with any dopants that increase conductivity to an acceptable level, if applicable), and will exhibit contact resistance that is lower than the contact resistance of devices made using conventional silicide and germanide contact processes. As will be appreciated, any number of semiconductor devices or circuitry having a need for high performance contacts can benefit from the low resistance contact techniques provided herein.

Thus, transistor structures configured in accordance with embodiments of the present invention provide an improvement over conventional structures with respect to lower contact resistance. Numerous process variations will be apparent in light of this disclosure. For instance, the III-V semiconductor material can be deposited on the source-drain regions before an insulator layer is deposited above the source/drain layer. Alternatively, the III-V semiconductor material can be deposited on the source-drain regions after an insulator layer is deposited above the source/drain layer regions and contact trenches have been etched to the source/drain layer.

Methodology and Architecture

FIG. 1A is a method for forming a transistor structure with low contact resistance in accordance with an embodiment of the present invention. FIGS. 2A through 2F illustrate example structures that are formed as the method is carried out, and in accordance with some embodiments.

The example method includes forming 102 one or more gate stacks on a semiconductor substrate upon which a MOS device may be formed. The MOS device may comprise NMOS or PMOS transistors, or both NMOS and PMOS transistors (e.g., for CMOS devices). FIG. 2A shows an example resulting structure, which in this case includes both NMOS and PMOS transistors formed on the same substrate 300 and separated by a shallow trench isolation (STI). Other suitable forms of isolation between p-type and n-type regions can be used as well. As can be seen, each gate stack is formed over a channel region of a transistor, and includes a gate dielectric layer 302, a gate electrode 304, an optional hardmask 306, and spacers 310 are formed adjacent to the gate stack.

The gate dielectric 302 can be, for example, any suitable oxide such as silicon dioxide ($SiO_2$) or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 302 to improve its quality when a high-k material is used. In some specific example embodiments, the high-k gate dielectric layer 302 may have a thickness in the range of 5 Å to around 100 Å thick (e.g., 10 Å). In other embodiments, the gate dielectric layer 302 may have a thickness of one monolayer of oxide material. In general, the thickness of the gate dielectric 302 should be sufficient to electrically isolate the gate electrode 304 from the source and drain contacts. In some embodiments, additional processing may be performed on the high-k gate dielectric layer 302, such as an annealing process to improve the quality of the high-k material.

The gate electrode 304 material can be, for example, polysilicon, silicon nitride, silicon carbide, or a metal layer (e.g., tungsten, titanium nitride, tantalum, tantalum nitride) although other suitable gate electrode materials can be used as well. The gate electrode 304 material, which may be a sacrificial material that is later removed for a replacement metal gate (RMG) process, has a thickness in the range of 10 Å to 500 Å (e.g., 100 Å), in some example embodiments.

The optional gate hard mask layer 306 can be used to provide certain benefits or uses during processing, such as protecting the gate electrode 304 from subsequent etch and/or ion implantation processes. The hard mask layer 306 may be formed using typical hard mask materials, such as such as silicon dioxide, silicon nitride, and/or other conventional insulator materials.

The gate stack can be formed as conventionally done or using any suitable custom techniques (e.g., conventional patterning process to etch away portions of the gate electrode and the gate dielectric layers to form the gate stack, as shown in FIG. 2A). Each of the gate dielectric 302 and gate electrode 304 materials may be formed, for example, using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric 302 and gate electrode 304 materials may be thermally grown. As will be appreciated in light of this disclosure, any number of other suitable materials, geometries, and formation processes can be used to implement an embodiment of the present invention, so as to provide a low contact resistance transistor device or structure as described herein.

The spacers 310 may be formed, for example, using conventional materials such as silicon oxide, silicon nitride, or other suitable spacer materials. The width of the spacers 310 may generally be chosen based on design requirements for the transistor being formed. In accordance with some embodiments, however, the width of the spacers 310 is not subject to design constraints imposed by the formation of the source and drain epi-tips, given sufficiently high boron doped germanium content in the source/drain tip regions.

Any number of suitable substrates can be used to implement substrate 300, including bulk substrates, semiconductors-on-insulator substrates (XOI, where X is a semiconductor material such as silicon, germanium, or germanium-enriched silicon), and multi-layered structures, including those substrates upon which fins or nanowires are formed prior to a subsequent gate patterning process. In some specific example cases, the substrate 300 is a germanium or silicon or SiGe bulk substrate, or a germanium or silicon or SiGe on oxide substrate. Although a few examples of materials from which the substrate 300 may be formed are described here, any material that may serve as a foundation upon which a low contact resistance semiconductor device may be built falls within the spirit and scope of the claimed invention.

With further reference to FIG. 1A, after the one or more gate stacks are formed, the method continues with defining 104 the source/drain regions of the transistor structure. The source/drain regions can be implemented with any number of suitable processes and configurations. For example, the source/drain regions may be implanted, etched and epi filled, raised, silicon or germanium or SiGe alloy, p-type and/or n-type, and have a planar or fin or wire shaped diffusion region. For instance, in some such example cases, the source and drain regions can be formed using either an implantation/diffusion process or an etching/deposition process. In the former process, dopants such as boron, aluminum, antimony, phosphorous, or arsenic may be ion-implanted into the substrate 300 to form the source and drain regions. The ion implantation process is typically followed by an annealing process that activates the dopants and may also cause them to diffuse further into the substrate 300. In the latter process, the substrate 300 may first be etched to form recesses at the locations of the source and drain regions. An epitaxial deposition process may then be carried out to fill the recesses with a silicon alloy such as silicon germanium or silicon carbide, thereby forming the source and drain regions. In some implementations the epitaxially deposited silicon alloy may be doped in-situ or ex-situ with dopants such as boron, arsenic, or phosphorous.

In the example embodiment shown in FIGS. 2A-2F, substrate 300 has been etched to provide cavities as well as respective tip areas which undercut the gate dielectric 302. The cavities and tip areas have been filled to provide the source/drain regions and the optional tip regions. In accordance with some specific example embodiments where the substrate 300 is a silicon bulk or silicon-on-insulator (SOI) substrate, the source and drain cavities along with their respective tip areas are filled with in-situ doped silicon or SiGe or germanium thereby forming the source and drain regions (along with their respective epi-tip). Any number of source/drain layer configurations can be used here, with respect to materials (e.g., doped or undoped Si, Ge, SiGe), dopant (e.g., boron, arsenic, or phosphorous), and geometries (e.g., thickness of source/drain layer may range, for instance, from 50 to 500 nm so as to provide a flush or raised source/drain regions).

As will be appreciated in light of this disclosure, any number of other transistor features may be implemented with an embodiment of the present invention. For instance, the channel may be strained or unstrained, and the source/drain regions may or may not include tip regions formed in the area between the corresponding source/drain region and the channel region. In this sense, whether a transistor structure has strained or unstrained channels, or source-drain tip regions or no source-drain tip regions, is not particularly relevant to various embodiments of the present invention, and such embodiments are not intended to be limited to any particular such structural features. Rather, any number of transistor structures and types, and particularly those structures have both n-type and p-type source/drain transistor regions, can benefit from employing a small bandgap and/or otherwise sufficiently doped III-V material layer over the source/drain regions as described herein. In general, if the bandgap is small enough, then no dopant is needed at room temperature (although dopant can be used, if so desired). In one specific example case, InSb serves both p and n type source/drain regions with no doping. For larger bandgap III-V materials (>0.5 eV), doping can be used to provide the desired conductivity.

Figure 2B:
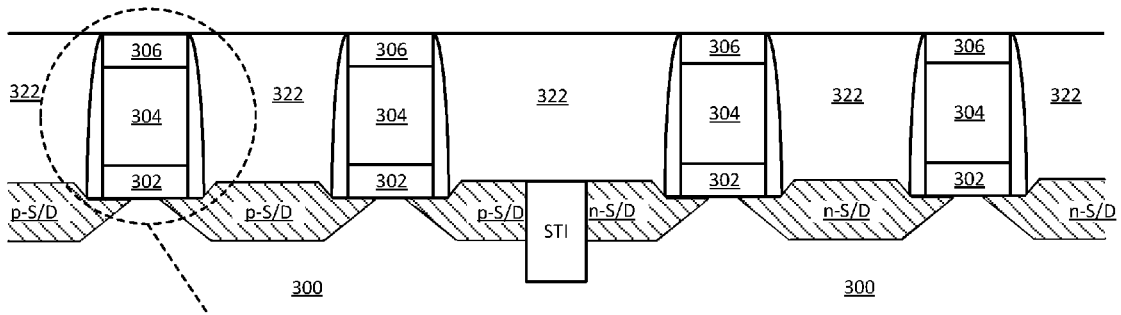
Figure 2B:
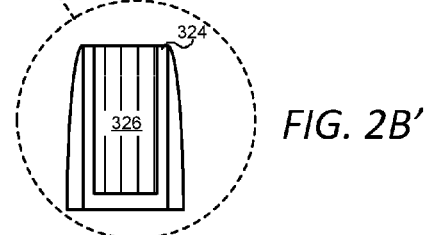

With further reference to FIG. 1A, after the source/drain regions are defined, the method of this example embodiment continues with depositing 106 an insulator layer 322. FIG. 2B shows insulator layer 322 as being flush with the hard mask 306 of the gate stack, but it need not be. The insulator can be configured in a number of ways. In some embodiments, insulator layer 322 is implemented with $SiO_2$ or other low-k insulator materials. In a more general sense, the dielectric constant of the layer 322 materials can be selected as desired. In some embodiments, insulator layer 322 may include a liner (e.g., silicon nitride) followed by one or more layers of $SiO_2$, or any combination of nitride, oxide, oxynitride, carbide, oxycarbide, or other suitable insulator materials. The insulator layer 322, which may be referred to as an interlayer dielectric (ILD), may be planarized as commonly done (e.g., by way of a post-deposition planarization process, such as chemical mechanical planarization, or CMP). Other example insulator materials that can be used to form layer 322 include, for instance, carbon doped oxide (CDO), organic polymers such as perfluorocyclobutane or polytetrafluoroethylene, fluorosilicate glass (FSG), and organosilicates such as silsesquioxane, siloxane, or organosilicate glass. In some example configurations, the insulator layer 322 may include pores or other voids to further reduce its dielectric constant.

As will be appreciated in light of this disclosure, and in accordance with some embodiments of the present invention where a replacement metal gate (RMG) process is used, the method may further include removing the gate stack (including the high-k gate dielectric layer 302, the sacrificial gate electrode 304, and the hard mask layer 306) using an etching process as conventionally done. In some such cases, only the sacrificial gate 304 and hard mask layer 306 are removed. If the gate dielectric layer 302 is removed, the method may continue with depositing a new gate dielectric layer into the trench opening. Any suitable gate dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material. In such RMG processes, the method may further include depositing the gate electrode layer into the trench and over the gate dielectric layer. Conventional deposition processes may be used to form the replacement gate electrode, such as CVD, ALD, and PVD. The gate electrode layer may include, for example, a p-type workfunction metal, such as ruthenium, palladium, platinum, cobalt, nickel, and conductive metal oxides, e.g., ruthenium oxide. In some example configurations, two or more metal gate electrode layers may be deposited. For instance, a workfunction metal may be deposited in the gate trench followed by a suitable metal gate electrode fill metal such as aluminum or silver. FIG. 2B' shows an example gate structure resulting from such an optional RMG process, which includes a replacement gate electrode layer 326 over a replacement gate dielectric layer 324. Still in other embodiments, such RMG processing can take place later in the method (e.g., after step 114), so that the replacement gate materials will not be subjected to the processing associated with steps 108 through 114.

Figure 2C:
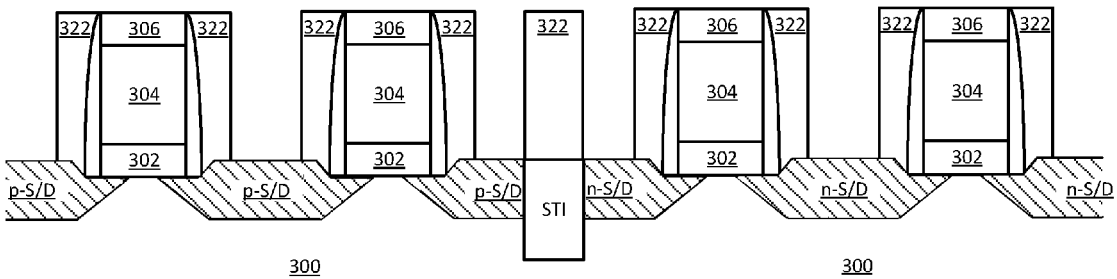

With further reference to FIG. 1A, after insulator layer 322 is provided (and any desired pre-contact formation RMG process), the method continues with etching 108 to form the source/drain contact trenches. Any suitable dry and/or wet etch processes can be used. FIG. 2C shows the source/drain contact trenches after etching is complete, in accordance with one example embodiment.

Figure 2D:
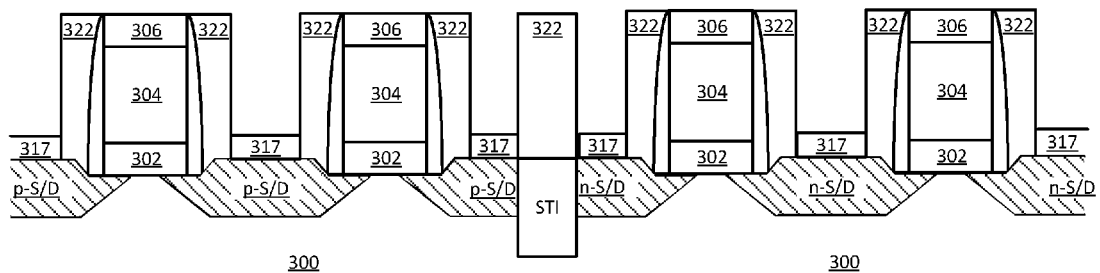

The method continues with depositing 110 a III-V semiconductor material layer on the source/drain regions of the transistor structure. FIG. 2D shows the III-V material layer 317 over both n-type and p-type source/drain regions, in accordance with one example embodiment. This deposition can be carried out non-selectively, where any excess III-V deposition is subsequently removed from the top of insulator 322 (and gate stacks, if necessary). In other embodiments, the deposition can be carried out selectively, where the III-V material deposition is only on the source/drain regions (or a sub-set thereof). For instance, in some example embodiments, the deposition 110 is selective in that the process includes masking of p-type regions or n-type regions followed by selective deposition to achieve deposition uniquely in one or another of the regions (e.g., where p-type regions receive a III-V material compound having a first doping scheme, and n-type regions receive a III-V material compound having a second doping scheme). Alternatively, the deposition 110 can be made with a single composition of undoped III-V material on all source/drain regions, followed by subsequent masking and doping to further optimize contact resistance to the doping type of the underlying source/drain material. Alternatively, the deposition 110 can be made with a single composition of undoped III-V material on all source/drain regions, where the undoped III-V material has a bandgap of less than 0.5 eV (e.g., bandgap of $In_xGa_{1-x}As$=0.427 eV, where x=0.9). In some such small bandgap cases, the bandgap is less than 0.4 eV (e.g., bandgap of InAs=0.36 eV). In still other such cases, the bandgap is less than 0.3 eV. In still other such cases, the bandgap is less than 0.2 eV (e.g., bandgap of InSb=0.17 eV). In still other such cases, the bandgap is within a range, such as between 0.1 eV and 0.4 eV, or 0.1 eV and 0.25 eV, or 0.25 eV and 0.5 eV or 0.15 eV and 0.35 eV. Note, however, that the III-V materials need not be limited to having a bandgap of less than 0.5 eV. This is because the III-V material can be deposited, for instance, with in-situ doping, diffusion doping, or implant doping such that it is tailored to the doping type of the underlying source/drain material.

In some example embodiments, the III-V material layer 317 is epitaxially deposited. The thickness of the III-V material layer 317 may be in the range, for example, of 50 to 250 Å, in accordance with some specific example embodiments, although other embodiments may have other layer thicknesses, as will be apparent in light of this disclosure. In some embodiments, a CVD process or other suitable deposition technique may be used for the depositing 108 or otherwise forming the III-V material layer 317. For example, the depositing 108 may be carried out in a CVD, or rapid thermal CVD (RT-CVD), or low pressure CVD (LP-CVD), or ultra-high vacuum CVD (UHV-CVD), or gas source molecular beam epitaxy (GS-MBE) tool using III-V material compounds, such as combinations of Al, Ga, In, P, As, Sb, and/or precursors thereof. In one specific such example embodiment, the III-V material layer 317 is implemented with undoped indium antimonide (InSb). In another embodiment, the III-V material layer 317 is implemented with GaAs doped with Ge to provide substitutional Ge concentrations of 1E19 atom/cm$^3$ or higher, which results in resistivity of about 5E-3 Ohm-cm (or a corresponding conductivity of about 200 Mho/cm). In any such embodiments, there may be a carrier gas such as, for instance, hydrogen, nitrogen, or a noble gas (e.g., precursor is diluted at 1-20% concentration with the balance being carrier gas). In some example cases, there may be an arsenic precursor such as arsine or TBA, a gallium precursor such as TMG, and/or an indium precursor such as TMI. There may also be an etchant gas such as, for example, halogen-based gas such as hydrogen chloride (HCl), chlorine (Cl), or, hydrogen bromide (HBr). The basic deposition of the III-V semiconductor material layer 317 is possible over a wide range of conditions using deposition temperature in the range, for example, of 300° C. to 700° C. (e.g., 400-500° C.) and reactor pressure, for instance, in the range 1 Torr to 760 Torr. Each of the carrier and etchants can have a flow in the range of 10 and 300 SCCM (typically, no more than 100 SCCM of flow is required, but some embodiments may benefit from higher flow rates). In one specific example embodiment, the deposition 110 is carried out at a flow rate that ranges between 100 and 1000 SCCM. For an in-situ doping of germanium, for instance, diluted germane or digermane may be used (e.g., the germane may be diluted in H2 at 10% concentration and at a flow rate that ranges between 10 and 100 sccm).

As will be appreciated in light of this disclosure, the selectivity at which the III-V material layer 317 is deposited can vary as desired. In some cases, for instance, the III-V material layer 317 is deposited only on the source/drain regions or a portion of the source/drain regions (rather than across the entire structure). Any number of masking/patterning techniques can be used further define subset regions to selectively deposit layer 317. Moreover, other embodiments may benefit from layer 317 covering, for example, exposed poly gate regions or exposed grounding tap regions. As will further be appreciated in light of this disclosure, the III-V material layer 317 can be used to realize significantly lower contact resistance in the source and drain regions (and other areas where low contact resistance is desirable, such as ground tap regions), in accordance with some example embodiments.

Figure 2E:
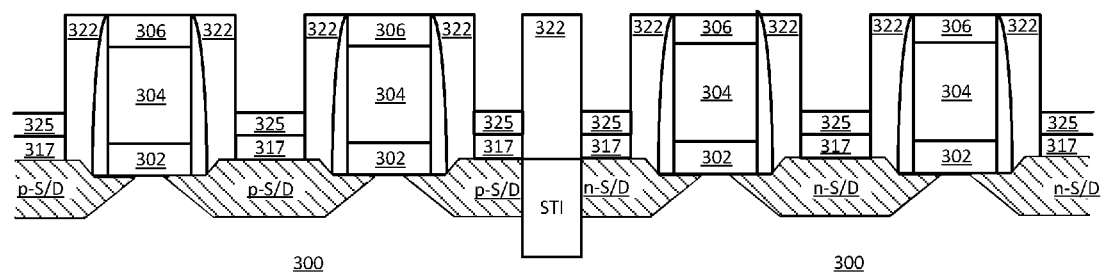
Figure 2F:
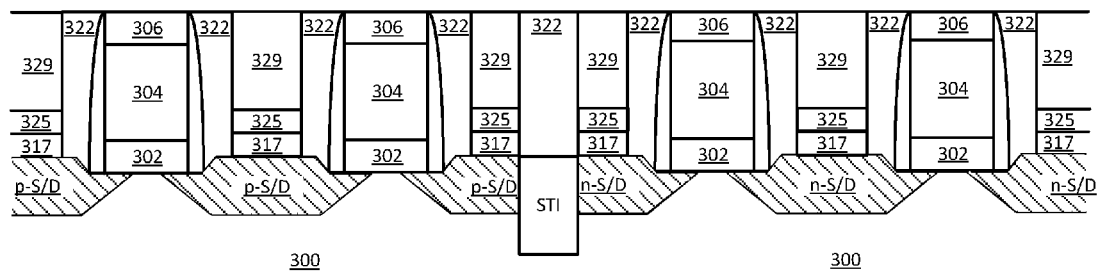

The method then continues with depositing 112 contact resistance reducing metal and annealing, and then depositing 114 the source/drain contact plugs. Note in such embodiments that there is no silicide or germanide. Rather, any reaction is between the III-V material 317 and the metallic contact resistance reduction layer 325. FIG. 2E shows the contact resistance reducing metals 325, which in some embodiments include silver, nickel, aluminum, titanium, gold, gold-germanium, nickel-platinum or nickel-aluminum, and/or other such resistance reducing metals or alloys. Other embodiments may further include additional layers, such as adhesion layers between layer 317 and layer 325, if so desired. FIG. 2F shows the contact plug metal 329, which in some embodiments includes aluminum or tungsten, although any suitably conductive contact metal or alloy can be used, such as silver, nickel-platinum or nickel-aluminum or other alloys of nickel and aluminum, or titanium, using conventional deposition processes. In some example case, transistors having a source/drain configured with III-V material layer 317 at the interface between the source/drain regions and the contact resistance reducing metal 325, can exhibit resistivity values of less than 100 Ohm-um, and in some cases less than 90 Ohm-um, and in some cases less than 80 Ohm-um, and in some cases less than 75 Ohm-um, or lower.

Figure 3A:
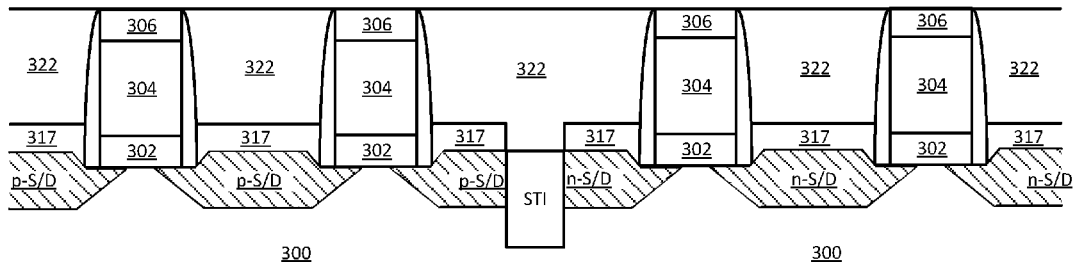
FIGS. 3A to 3C illustrate alternative structures that are formed when carrying out the method of FIG. 1B, in accordance with another embodiment of the present invention.
Figure 3B:
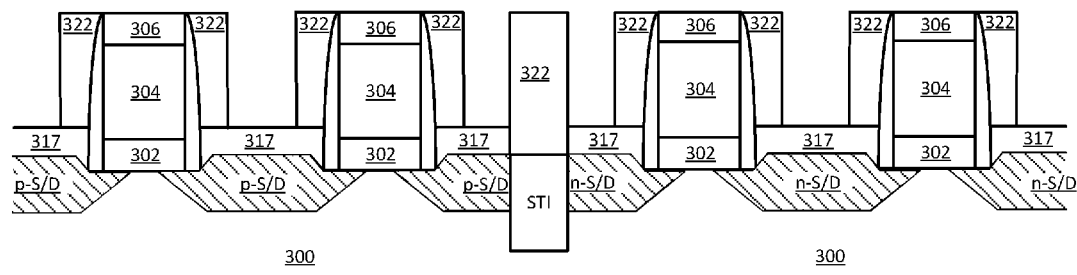
Figure 3C:
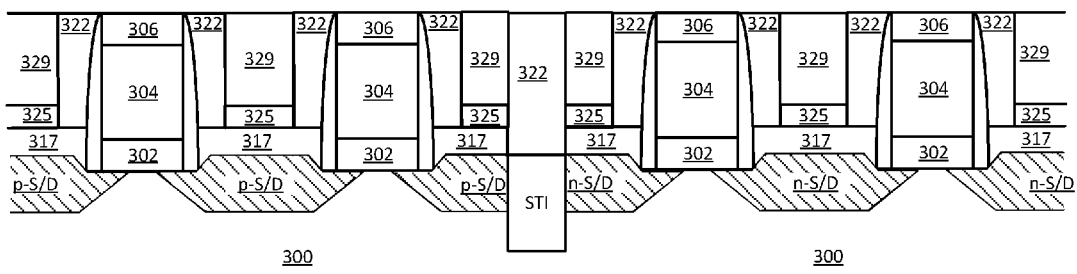

FIG. 1B is a method for forming a transistor structure with low contact resistance in accordance with another embodiment of the present invention. FIGS. 3A through 3C illustrate alternative example structures that are formed. In general, this method is similar to the method described with reference to FIGS. 1A and 2A-F, except that the deposition of the III-V material layer 317 on the source/drain regions is carried out prior to deposition of the insulator 322. This is effectively indicated in FIG. 1B by moving the germanium material depositing 110 to be after the source/drain defining 104 and prior to the insulator depositing 106. This resulting structure after insulator deposition 106 is shown in FIG. 3A. Note how in this example embodiment the III-V material layer 317 entirely covers each of the shown source/drain regions, rather than just the portion exposed by the contact trench (as best shown in FIG. 2D). FIG. 3B shows the resulting structure after the contact trenches are etched at 108, and FIG. 3C shows the resulting structure after the contact resistance reducing metal 325 and metal contact plugs 329 are deposited at 112 and 114, respectively. As will be appreciated, the previous relevant discussion with respect to similar parts of the example method discussed with reference to FIG. 1A is equally applicable here.

Non-Planar Configuration

A non-planar architecture can be implemented, for instance, using FinFETs or nanowire configurations. A Fin-FET is a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate FinFET. Other types of FinFET configurations are also available, such as so-called double-gate FinFETs, in which the conductive channel principally resides only along the two sidewalls of the fin (and not along the top of the fin). A nanowire transistor (sometimes referred to as gate-all-around FET) is configured very similarly, but instead of a fin, a nanowire (e.g., silicon or SiGe or Ge nanowire) is used and the gate material generally surrounds the channel region on all sides. Depending on the particular design, nanowire transistors have, for instance, four effective gates.

Figure 4A:
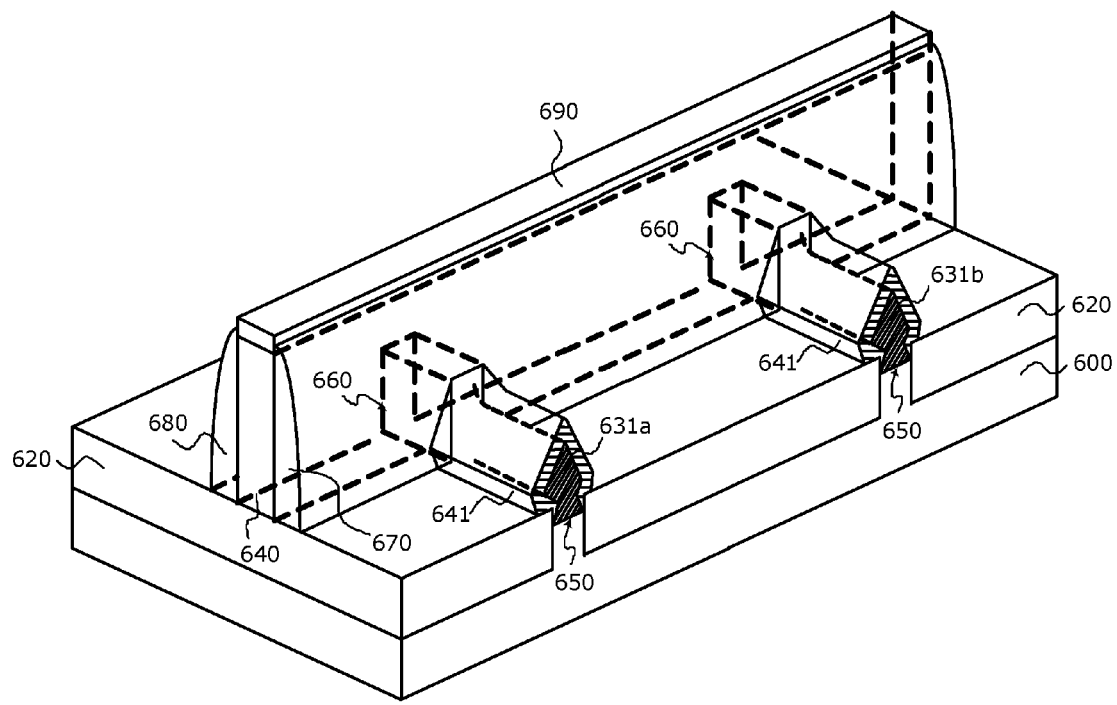
FIG. 4A-E each show a perspective view of a non-planar transistor architecture, configured in accordance with one embodiment of the present invention.
Figure 4B:
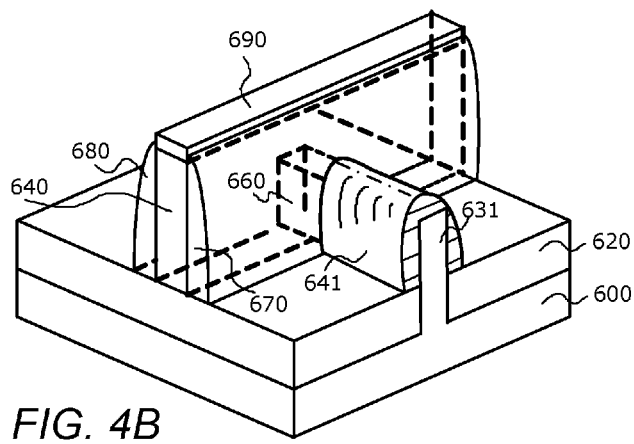
Figure 4C:
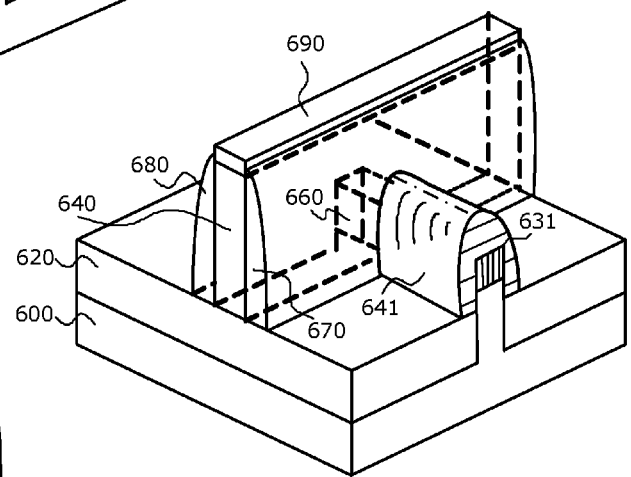
Figure 4D:
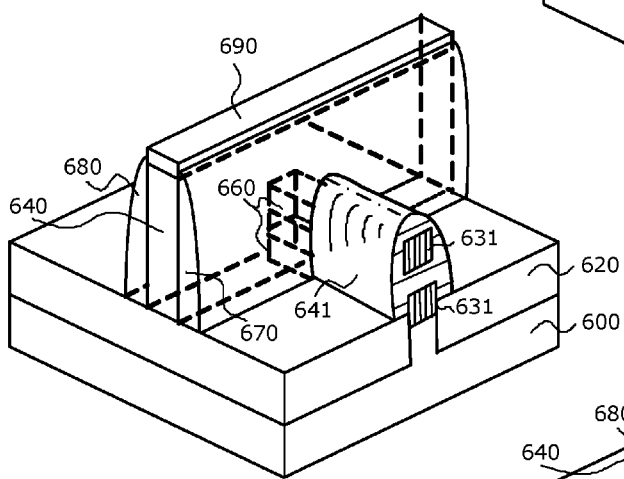
Figure 4E:
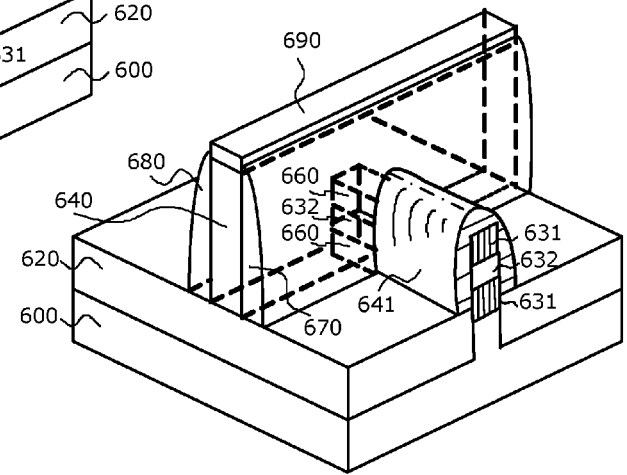

FIGS. 4A-4E each show a perspective view of an example non-planar architecture, configured in accordance with one embodiment of the present invention. Specifically, FIGS. 4A-B each shows a perspective view of a FinFET transistor structure and FIGS. 4C-E show example nanowire channel transistor structures. Each of the figures will now be discussed in turn.

As can be seen, the example non-planar configuration shown in FIG. 4A is implemented with tri-gate devices each of which includes a substrate 600 having a semiconductor body or fin 660 extending from the substrate 600 through isolation regions 620. A gate electrode 640 is formed over three surfaces of the fin 660 to form three gates. A hard mask 690 is formed on top of the gate electrode 640. Gate spacers 670, 680 are formed at opposite sidewalls of the gate electrode 640. A p-type source region comprises the epitaxial region 631a formed on a recessed source interface 650 and on one fin 660 sidewall, and a drain region comprises the epitaxial region 631a formed on a recessed source interface 650 and on the opposing fin 660 sidewall (not shown). In addition, an n-type source region comprises the epitaxial region 631b formed on a recessed source interface 650 and on one fin 660 sidewall, and a drain region comprises the epitaxial region 631b formed on a recessed source interface 650 and on the opposing fin 660 sidewall (not shown). A III-V material cap layer 641 is deposited over the source/drain regions 631a and 631b. Note that the III-V material cap layer 641 may be provided in the recessed (tip) regions, but in other embodiments is just provided over the source/drain regions (and not in the recessed regions). In one embodiment, the isolation regions 620 are shallow trench isolation (STI) regions formed using conventional techniques, such as etching the substrate 600 to form trenches, and then depositing oxide material onto the trenches to form the STI regions. The isolation regions 620 can be made from any suitable dielectric/insulative material, such as SiO$_2$. The previous discussion with respect to the substrate 300 is equally applicable here (e.g., substrate 600 may be a silicon substrate, or XOI substrate such as a SOI substrate, or a multi-layered substrate). As will be appreciated in light of this disclosure, conventional processes and forming techniques can be used to fabricate the FinFET transistor structure. However, and in accordance with one example embodiment of the present invention, the structure of the source/drain regions 631a and 631b and cap layer 641 can be implemented, for instance, using an in-situ doped silicon or SiGe (for 631a and 631b) capped with a III-V material layer (for 641). As will further be appreciated, note that an alternative to the tri-gate configuration is a double-gate architecture, which includes a dielectric/isolation layer on top of the fin 660. Further note that the example shape of the source/drain regions 631 (a and b) shown in FIG. 4A is not intended to limit the claimed invention to any particular source/drain types or formation processes, and other source/drain shapes (both p and n) will be apparent in light of this disclosure (e.g., round, square or rectangular p and n source/drain regions may be implemented).

As will be appreciated, the source/drain regions 631 (a and b) shown in FIG. 4A were formed using a replacement process (e.g., etching, epitaxy deposition, etc). However, in other embodiments, source/drain regions 631 can be part of the fin 660 formed from the substrate 600 material itself, as best shown in FIG. 4B. Only one source/drain region 631 is shown, but numerous such regions can be implemented in a similar fashion (including both n-type and p-type S/D regions). A III-V material cap layer 641 is deposited over the source/drain regions 631 in a similar fashion as previously discussed with reference to FIG. 4A. Other relevant discussion provided with respect to FIG. 4A is also equally applicable here, as will be appreciated.

Another alternative is the nanowire channel architecture which may include, for example, a pedestal of substrate 600 material upon which a nanowire 660 (e.g., silicon or SiGe) is grown or otherwise provided, as best shown in FIG. 4C. Similar to the fin structure shown in FIG. 4B, the nanowire 660 includes source/drain regions 631 (only one shown, but multiple such regions can be implemented, including both p-type and n-type, as previously explained). Just as with a fin structure, the source/drain regions 631 can be formed from substrate 600 material (from which the nanowires are fabricated) or one or more replacement materials (e.g., silicon or SiGe). The III-V material 641 can be provided, for instance, around all of the source/drain regions 631 of nanowire 660 or just a portion of the nanowire 660 (e.g., all except the portion on the pedestal). FIG. 4D illustrates a nanowire configuration having multiple nanowires 660 (two in this example case). As can be seen, one nanowire 660 is provided in a recess of substrate 600 and the other effectively floats in the III-V material 641 layer. The corresponding source/drain regions 631 are shown with vertical cross-hatching, and may be p-type and/or n-type source/drain regions. FIG. 4E also illustrates a nanowire configuration having multiple nanowires 660, but in this example case, non-active material 632 is not removed from between the individual nanowires during the nanowire forming process, which can be carried out using various conventional techniques, as will be appreciated in light of this disclosure. Thus, one nanowire 660 is provided in a recess of substrate 600 and the other nanowire 660 effectively sits on top of the material 632. Note the nanowires 660 are active through the channel, but the 632 material is not. The III-V material 641 layer is provided around all other exposed surfaces of the nanowires 660. The corresponding source/drain regions 631 are shown with vertical cross-hatching, and may be p-type and/or n-type source/drain regions.

Example System

Figure 5:
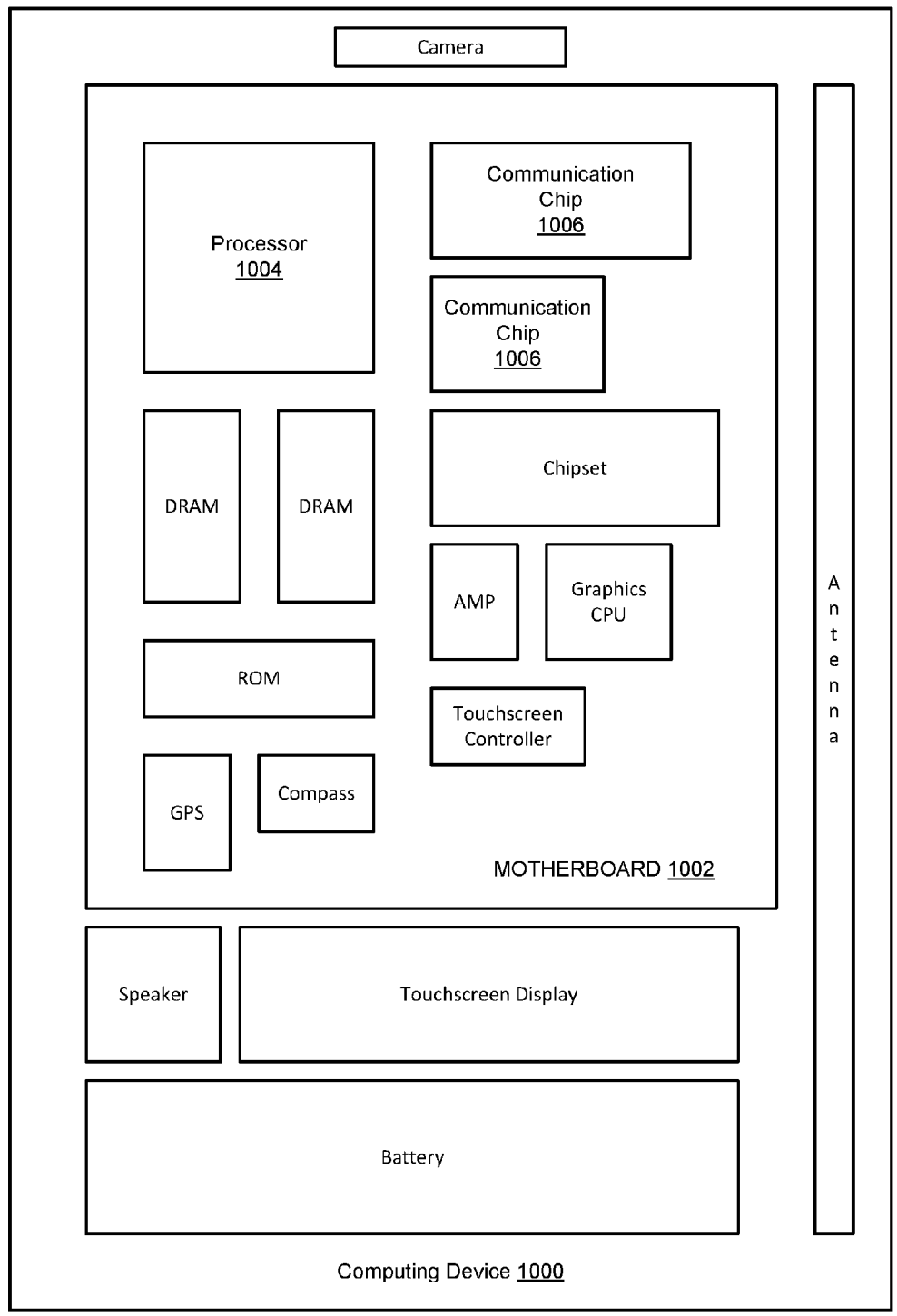
FIG. 5 illustrates a computing system implemented with one or more transistor structures in accordance with an example embodiment of the present invention.

FIG. 5 illustrates a computing system 1000 implemented with one or more transistor structures configured in accordance with an example embodiment of the present invention. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more transistor structures as described herein (e.g., having a small bandgap or suitably doped III-V material layer over both n-type and p-type source/drain regions to provide lower contact resistance/improved conductivity). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more CMOS transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs low contact resistance transistor devices as described herein (e.g., CMOS devices having both p and n type devices).

Numerous embodiments will be apparent, and features described herein can be combined in any number of configurations. One example embodiment of the present invention provides a semiconductor integrated circuit. The integrated circuit includes a substrate having a number of channel regions, and a gate electrode above each channel region, wherein a gate dielectric layer is provided between each gate electrode and a corresponding channel region. The integrated circuit further includes p-type source/drain regions in the substrate and adjacent to a corresponding channel region, and n-type source/drain regions in the substrate and adjacent to a corresponding channel region. The integrated circuit further includes a III-V semiconductor material layer on at least a portion of the p-type source/drain regions and a portion of the n-type source drain regions. The integrated circuit further includes a metal contact on the III-V semiconductor material layer. In some cases, the III-V semiconductor material layer is undoped. In some example cases, the III-V semiconductor material layer has a bandgap of less than 0.5 eV. In other example cases, the III-V semiconductor material layer has a bandgap of less than 0.2 eV. In some cases, the III-V semiconductor material layer is doped. In some such cases, the III-V semiconductor material layer has a doping scheme that is the same for both the p-type and n-type source/drain regions. In other such cases, the III-V semiconductor material layer has a first doping scheme for the p-type source/drain regions and a second doping scheme for the n-type source/drain regions. The III-V semiconductor material layer can be doped, for example, with one or more amphoteric dopants (C, Si, Ge, and/or Sn). In one such case, the III-V semiconductor material layer is doped with one or more amphoteric dopants to greater than a 1E18 atoms/cm$^3$ substitutional concentration. The device can be implemented, for example, with a planar transistor architecture, or a non-planar transistor architecture. In one such case, the non-planar transistor architecture comprises at least one of FinFET transistors and/or nanowire transistors. In some cases, the p-type and n-type source/drain regions comprise silicon, germanium, or an alloy thereof. Another embodiment of the present invention provides an electronic device that includes a printed circuit board having one or more integrated circuits as variously defined in this paragraph. In one such case, the one or more integrated circuits comprise at least one of a communication chip and/or a processor. The device can be, for example, a computing device.

Another embodiment of the present invention provides a device, comprising a silicon-containing substrate having a number of channel regions, and a gate electrode above each channel region, wherein a gate dielectric layer is provided between each gate electrode and a corresponding channel region. The device further includes p-type source/drain regions in the substrate and adjacent to a corresponding channel region, the p-type source/drain regions comprising silicon, germanium, or an alloy thereof, and n-type source/drain regions in the substrate and adjacent to a corresponding channel region, the n-type source/drain regions comprising silicon, germanium, or an alloy thereof. The device further includes a III-V semiconductor material layer on at least a portion of the p-type source/drain regions and a portion of the n-type source drain regions, and a metal contact on the III-V semiconductor material layer for each of the p-type and n-type source/drain regions. In accordance with one specific example embodiment, a III-V material deposition of InSb on Si, SiGe alloy and Ge source/drain regions is predicted by simulations to give very low barrier to conduction. Other suitable III-V material layers will be apparent in light of this disclosure. In some cases, the III-V semiconductor material layer is undoped. In some cases, the III-V semiconductor material layer has a bandgap of less than 0.5 eV. In some cases, the III-V semiconductor material layer is doped. In some such cases, the III-V semiconductor material layer has a doping scheme that is the same for both the p-type and n-type source/drain regions. In other such cases, the III-V semiconductor material layer has a first doping scheme for the p-type source/drain regions and a second doping scheme for the n-type source/drain regions. In some cases, the III-V semiconductor material layer is doped with one or more amphoteric dopants such as Ge (e.g., to greater than a 1E18 atoms/cm$^3$ substitutional concentration).

Another embodiment of the present invention provides a method for forming a semiconductor device. The method includes providing a substrate having a number of channel regions, and providing a gate electrode above each channel region, wherein a gate dielectric layer is provided between each gate electrode and a corresponding channel region. The method further includes providing p-type source/drain regions in the substrate and adjacent to a corresponding channel region, and providing n-type source/drain regions in the substrate and adjacent to a corresponding channel region. The method further includes providing a III-V semiconductor material layer on at least a portion of the p-type source/drain regions and a portion of the n-type source drain regions. The method further includes providing a metal contact on the III-V semiconductor material layer.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. An integrated circuit, comprising:
   p-type source/drain regions adjacent to a corresponding channel region and comprising silicon, germanium, or silicon germanium;
   n-type source/drain regions adjacent to a corresponding channel region and comprising silicon, germanium, or silicon germanium;
   a doped III-V semiconductor material layer on at least a portion of the p-type source/drain regions and a portion of the n-type source/drain regions; and
   at least one contact structure on the III-V semiconductor material layer.

2. The integrated circuit of claim 1 wherein the III-V semiconductor material layer over some of the source/drain regions is undoped.

3. The integrated circuit of claim 1 wherein the III-V semiconductor material layer has a doping scheme that is the same for both the p-type and n-type source/drain regions.

4. The integrated circuit of claim 1 wherein the III-V semiconductor material layer has a first doping scheme for the p-type source/drain regions and a second doping scheme for the n-type source/drain regions.

5. The integrated circuit of claim 1 wherein the III-V semiconductor material layer is doped with one or more amphoteric dopants.

6. The integrated circuit of claim 1 wherein the p-type and n-type source/drain regions comprise silicon or silicon germanium.

7. The integrated circuit of claim 1 wherein at least one of the p-type and n-type source/drain regions comprises semiconductor material that is not native to a substrate from which the fins extend.

8. The integrated circuit of claim 1 wherein at least one of the channel regions comprises one or more nanowires.

9. The integrated circuit of claim 8 wherein the one or more nanowires include silicon, germanium, or silicon germanium.

10. An integrated circuit, comprising:
- a substrate having a plurality of fins extending therefrom, including first and second fins, each fin including a channel region;
- p-type source/drain regions adjacent to a corresponding channel region and comprising semiconductor material comprising silicon, germanium, or silicon germanium;
- n-type source/drain regions adjacent to a corresponding channel region and comprising semiconductor material comprising silicon, germanium, or silicon germanium;
- a III-V semiconductor material layer on at least a portion of the p-type source/drain regions and a portion of the n-type source/drain regions, the III-V semiconductor material layer having at least one of a bandgap below 0.5 eV and being doped; and
- at least one contact structure on the III-V semiconductor material layer;
- wherein at least one of the first and second fins comprises a semiconductor material that is not native to the substrate.

11. The integrated circuit of claim 10 wherein the semiconductor material of at least one of the p-type and n-type source/drain regions is not native to the substrate.

12. The integrated circuit of claim 10 wherein the semiconductor material of at least one of the p-type and n-type source/drain regions is silicon or silicon germanium.

13. The integrated circuit of claim 10 wherein at least one of the channel regions comprises one or more nanowires.

14. The integrated circuit of claim 13 wherein the one or more nanowires include silicon, germanium, or silicon germanium.

15. A integrated circuit, comprising:
- p-type source/drain regions adjacent to a corresponding channel region and comprising silicon, germanium, or silicon germanium;
- n-type source/drain regions adjacent to a corresponding channel region and comprising silicon, germanium, or silicon germanium;
- a III-V semiconductor material layer on at least a portion of the p-type source/drain regions and a portion of the n-type source/drain regions, the III-V semiconductor material layer having at least one of a bandgap below 0.5 eV and being doped; and
- at least one contact structure on the III-V semiconductor material layer;
- wherein at least one of the p-type and n-type source/drain regions are raised such that at least a portion of semiconductor material of the corresponding source/drain region is higher than the corresponding channel region.

16. The integrated circuit of claim 15 wherein at least one of the channel regions comprises one or more nanowires.

17. A integrated circuit, comprising:
- a first channel region;
- a second channel region;
- p-type source/drain regions adjacent to the first channel region, the p-type source/drain regions comprising silicon, germanium, or silicon germanium;
- n-type source/drain regions adjacent to the second channel region, the n-type source/drain regions comprising silicon, germanium, or an alloy thereof;
- a III-V semiconductor material layer on at least a portion of the p-type source/drain regions and a portion of the n-type source drain regions, the III-V semiconductor material layer having at least one of a bandgap below 0.5 eV and being doped; and
- at least one contact structure on the III-V semiconductor material layer for each of the p-type and n-type source/drain regions.

18. The integrated circuit of claim 17 wherein at least one of the first and second channel regions includes one or more nanowires.

19. The integrated circuit of claim 17 wherein at least one of the first and second channel regions includes a fin extending from a substrate.

* * * * *

UNITED STATES PATENT AND TRADEMARK OFFICE
CERTIFICATE OF CORRECTION

PATENT NO. : 9,705,000 B2
APPLICATION NO. : 15/212991
DATED : July 11, 2017
INVENTOR(S) : Glass et al.

It is certified that error appears in the above-identified patent and that said Letters Patent is hereby corrected as shown below:

On the Title Page

On Page 2, Column 1, under Related U.S. Application Data (continued from page 1, Column 1), please delete "filed as application No. PCT/US2011/066132 on Nov. 20, 2011, now Pat. No. 9,153,583." and insert --filed on Jun. 26, 2013, now Pat. No. 9,153,583, filed as application No. PCT/US2011/066132 on Dec. 20, 2011.--

Signed and Sealed this
Tenth Day of October, 2017

Joseph Matal
*Performing the Functions and Duties of the*
*Under Secretary of Commerce for Intellectual Property and*
*Director of the United States Patent and Trademark Office*